US010217496B1

(12) United States Patent
Nautiyal et al.

(10) Patent No.: US 10,217,496 B1
(45) Date of Patent: Feb. 26, 2019

(54) BITLINE WRITE ASSIST CIRCUITRY

(71) Applicant: Arm Limited, Cambridge (GB)

(72) Inventors: Vivek Nautiyal, Milpitas, CA (US); Jitendra Dasani, Cupertino, CA (US); Satinderjit Singh, Fremont, CA (US); Shri Sagar Dwivedi, San Jose, CA (US); Bo Zheng, Cupertino, CA (US); Fakhruddin Ali Bohra, San Jose, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/907,951

(22) Filed: Feb. 28, 2018

(51) Int. Cl.
*G11C 7/00* (2006.01)
*G11C 7/12* (2006.01)
*G11C 7/10* (2006.01)
*G11C 11/4097* (2006.01)
*G11C 11/419* (2006.01)

(52) U.S. Cl.
CPC .............. *G11C 7/12* (2013.01); *G11C 7/1096* (2013.01); *G11C 11/4097* (2013.01); *G11C 11/419* (2013.01)

(58) Field of Classification Search
CPC ..... G11C 7/12; G11C 7/1096; G11C 11/4097; G11C 11/419
See application file for complete search history.

(56) References Cited

U.S. PATENT DOCUMENTS

| | | | | |
|---|---|---|---|---|
| 2009/0296488 A1* | 12/2009 | Nguyen | ................... | G11C 7/02 365/185.21 |
| 2013/0279255 A1* | 10/2013 | Kamata | ................... | G11C 16/26 365/185.11 |
| 2016/0217840 A1* | 7/2016 | Bartling | ................... | G06F 13/00 |

* cited by examiner

*Primary Examiner* — Uyen B Tran
(74) *Attorney, Agent, or Firm* — Pramudji Law Group PLLC; Ari Pramudji

(57) ABSTRACT

Various implementations described herein are directed to an integrated circuit with memory circuitry having an array of bitcells that are accessible via multiple bitlines. The integrated circuit may include a write driver coupled to at least one bitline of the multiple bitlines through a column multiplexer. The integrated circuit may include a pass transistor coupled to the write driver and the column multiplexer via a write data line. The integrated circuit may include a charge storage device coupled between the pass transistor and write assist enable circuitry. The integrated circuit may include a transmission gate coupled to a gate of the write driver. The integrated circuit may include a clamp transistor coupled between the gate of write driver and the charge storage device such that the clamp transistor receives a voltage assist signal from the charge storage device at the gate of the write driver.

20 Claims, 5 Drawing Sheets

BITLINE WRITE ASSIST CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional circuit designs, write assist schemes may be designed to assist with various write operations that seek to improve write margin by decreasing the write time. However, conventional negative bitline write assist is ineffective and deficient in that conventional operation often results in write failure. For instance, if a bitline is kept to a Vss level through a write driver for a long duration of time, then the bitcell may flip polarity, but the time taken to flip the bitcell may be large, e.g., when the bitcell does not suffer from a DC writeability problem. Further, in conventional negative bitline write assist, instead of keeping the bitline to a Vss level, the bitline may float and inject negative charge through capacitive coupling. For instance, as the bitline goes negative, the bitcell may flip polarity. However, because the bitline is floating and negative, the bitline may start to go high due to leakage from other access transistors of unselected bitcells in the column, from some column multiplexer transistors, and/or from the write driver. Therefore, if the applied negative voltage is not sufficient to flip the bitcell, then giving more write time may not provide write assist when the bitline is charging-up.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to bitline write assist circuitry including a self-compensating leakage scheme and technique for a floating bitline in negative bitline write assist circuitry. For instance, in some implementations, the bitline write assist circuitry described herein may mitigate write failure with a mechanism that uses the negative bitline write assist schemes and technique described herein.

As described herein below, various implementations assist with reducing (or, in some cases, eliminating) leakage through a write driver. In this instance, if a floating write assist signal (VSS_AST) is charged through a negative voltage supply (Vss), then a gate of a write driver pulldown transistor may be driven higher than the Vss write driver leakage, which may compensate for other leakages and may keep the bitline close to the negative voltage supply (Vss). For example, an output of a capacitor may be coupled to a gate of write driver, and when bitlines are floating, the capacitor may provide the negative voltage supply (Vss) to the gate of the write driver. This may cause the write driver to operate as a diode, and this arrangement may function as a self-compensating solution for leakage on a floating bitline. As the bitline voltage rises due to leakage from an access transistor, the write driver voltage (Vgs) may increase, and leakage through the write driver may then compensate for leakage from the access and pull down stack write driver of bitcells. This arrangement may ensure that the bitline remains at a low level and the write may be recovered by increasing a write operation setting. Further description related to the bitline write assist circuitry and various schemes and techniques associated therewith are described in greater detail herein below.

Various implementations of bitline write assist circuitry will be described in detail herein with reference to FIGS. 1-4.

Figure 1:
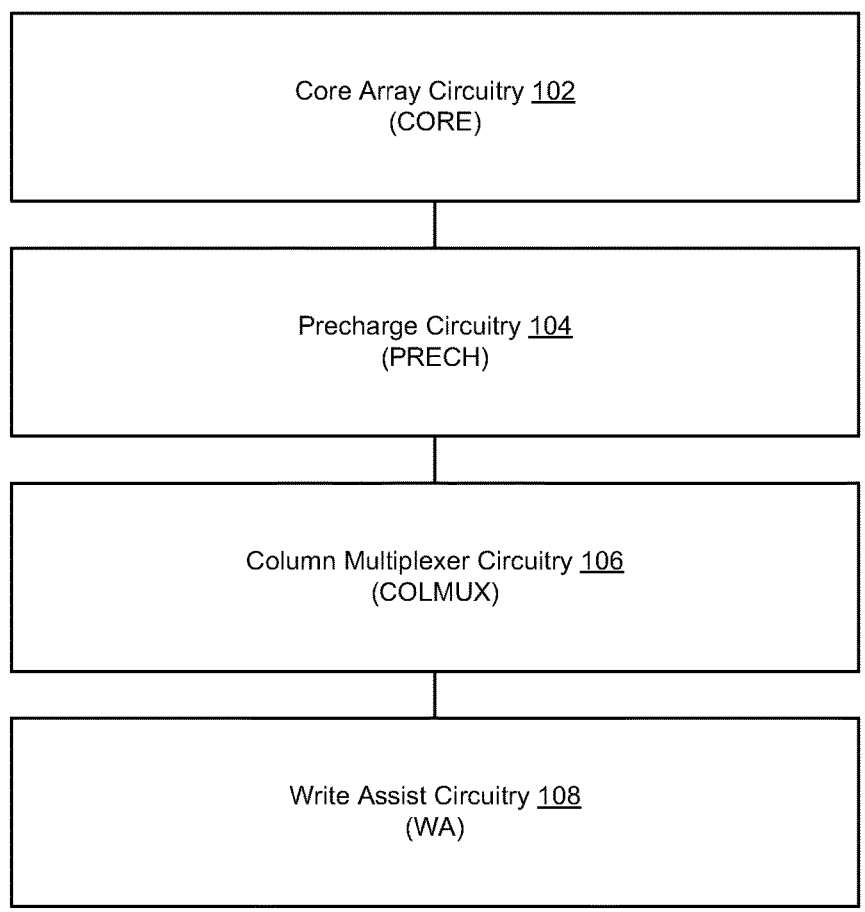
FIG. 1 illustrates a diagram of memory circuitry in accordance with various implementations described herein.

FIG. 1 illustrates a block diagram of memory circuitry 100 in accordance with various implementations described herein.

As shown in FIG. 1, the memory circuitry 100 includes various components including, e.g., core array circuitry 102 (CORE), precharge circuitry 104 (PRECH), column multiplexer circuitry 106 (COLMUX), and write assist circuitry 108 (WA). Further description related to the memory circuitry 100 and the various components associated therewith are described in greater detail herein below.

The memory circuitry 100 may be implemented as an integrated circuit (IC) in using various types of memory, such as, e.g., random access memory (RAM), including static RAM (SRAM), and/or any other types of volatile memory. In some instances, the memory circuitry 100 may be implemented as an IC with dual rail memory architecture and related circuitry. In other instances, the memory circuitry 100 may be integrated with computing circuitry and related components on a single chip. Further, the memory circuitry 100 may be implemented in an embedded system for various electronic and mobile applications, including low power sensor nodes.

As shown in FIG. 1, the memory circuitry 100 includes core array circuitry 102 (CORE) that has an array of memory cells, wherein each memory cell may be referred to as a bitcell. Further, each memory cell may be configured to store at least one data bit value (e.g., a data value related to a logical '0' or '1'). In various instances, the array of memory cells may include any number of memory cells (or bitcells) that are arranged in various applicable configurations, such as, e.g., a two-dimensional (2D) memory array having any number of columns (Ncolumns) and any number of rows (Nrows) of multiple memory cells arranged in a 2D grid pattern with 2D indexing capabilities.

In some cases, each memory cell may be implemented with random access memory (RAM) circuitry, or some other type of volatile type memory. For instance, each memory cell (or bitcell) may include a multi-transistor static RAM (SRAM) cell, including various types of SRAM cells, such as, e.g., 6T CMOS SRAM and/or various other types of complementary MOS (CMOS) SRAM cells, such as, e.g., 2T, 4T, 8T, 10T, 12T, 14T or more transistors per bit. Further, in some cases, the memory circuitry 102 may operate at one or more source voltage levels (e.g., Vdd, Vss, etc.) with a voltage range that varies with the applicable technology for specific integrated circuits (ICs).

Figure 2A:
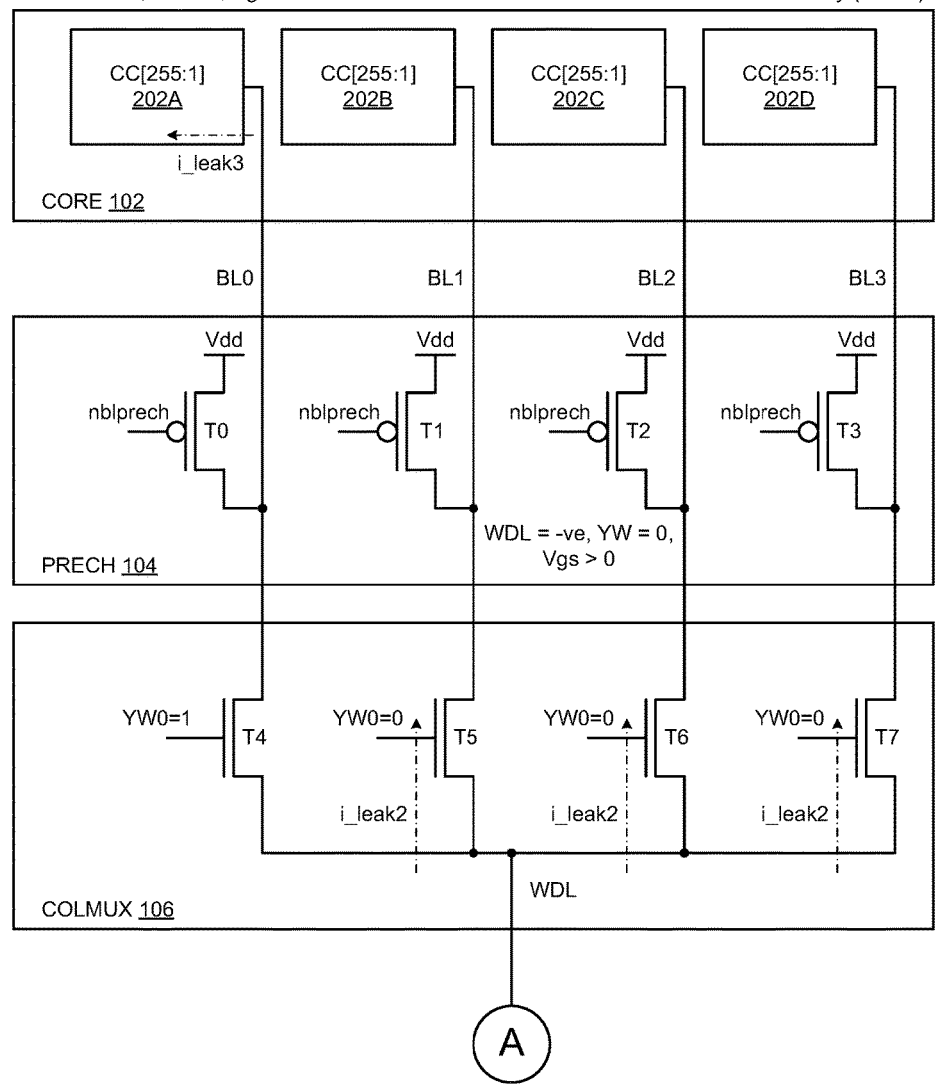
FIGS. 2A-2B illustrate various diagrams of memory circuitry in accordance with various implementations described herein.
Figure 2B:
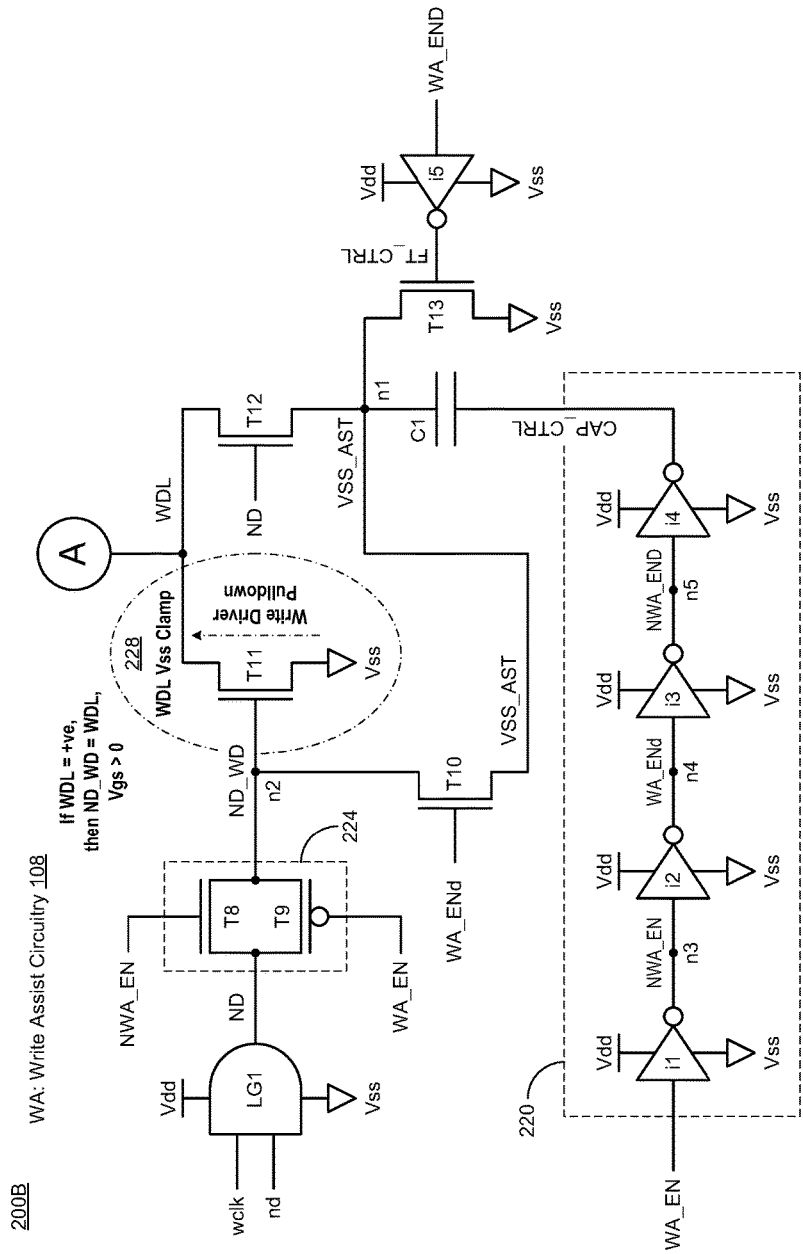

FIGS. 2A-2B illustrate various diagrams 200A, 200B of the memory circuitry 100 in accordance with various implementations described herein. As shown, FIG. 2A is coupled to FIG. 2B via a symbol A (i.e., circle A).

Referring to diagram 200A of FIG. 2A, the memory circuitry 100 may include the core circuitry 102 (CORE) having an array of memory cells that are arranged in columns and rows. As shown in FIG. 2, the CORE 102 may be embodied as a Mux 4:256×4 core array with one or more banks 202A, 202B, 202C, 202D of memory cells (or bitcells) having 256 rows of bitcells (CC[255:1]). The CORE 102 may include a row decoder (ROWDEC) and a column decoder (COLDEC) for accessing each of memory cell via a selected wordline (WL) and a selected bitline (BL, such as, e.g., BL0, BL1, BL2, BL3). As such, the CORE 102 may include one or more arrays of bitcells (e.g., banks 202A, 202B, 202C, 202D) that are accessible via at least one wordline (WL) and one or more bitlines (e.g., BL0, BL1, BL2, BL3). In some instances, the CORE 102 and various components thereof operates at a source voltage supply, such as, e.g., a core supply voltage Vdd along with ground or negative (−) voltage supply Vss. In other instances, the voltage range may vary with technology. The row decoder (ROWDEC) may operate at the core supply voltage Vdd, and other components, such as, e.g., a write driver may generate a write (WR) driver signal at another supply voltage that may be different than the core supply voltage Vdd, such as, e.g., the negative voltage supply Vss or some other voltage, such as, e.g., a periphery supply voltage Vddp. As described herein, the CORE 102 may operate with the following characteristics: BL=−ve, WL=0, and Vgs>0.

The memory circuitry 100 may include the precharge circuitry 104 (PRECH) having one or more precharge transistors (e.g., PMOS transistors T0, T1, T2, T3) that are arranged in parallel and coupled to corresponding bitlines (BL0, BL1, BL2, BL3). In some instances, each of the precharge transistors T0, T1, T2, T3 may be activated based on a precharge control signal (nblprech). Further, each of the precharge transistors T0, T1, T2, T3 may be coupled between the source voltage supply Vdd and a corresponding bitline (BL0, BL1, BL2, BL3). As described herein, the PRECH 104 may operate with the following characteristics: WDL=−ve, YW=0, and Vgs>0.

The memory circuitry 100 may include the column multiplexer circuitry 106 (COLMUX) having one or more column selector transistors (e.g., NMOS transistors T4, T5, T6, T7) that are arranged in parallel to operate as a multiplexer (Mux) and also coupled to corresponding bitlines (BL0, BL1, BL2, BL3). In some instances, each of the column selector transistors T4, T5, T6, T7 may be activated based on a column select control signal (yw, such as, e.g., YW0, YW1, YW2, YW3). Further, each of the column selector transistors T4, T5, T6, T7 may be coupled between a corresponding bitline (BL0, BL1, BL2, BL3) and a write data line (WDL).

Referring now to diagram 200B of FIG. 2B, the memory circuitry 100 includes the write assist circuitry 108 (WA) having various multiple components that are arranged and coupled together to generate a write assist signal (VSS_AST) as follows. Further, in some instances, as described herein, the write assist circuitry 108 (WA) may operate with the following characteristics: if WDL=+ve, then ND_WD=WDL, and Vgs>0.

The WA 108 may include a write driver T11 that is coupled to at least one bitline (e.g., corresponding bitline BL0, BL1, BL2, BL3) of the multiple bitlines through the column multiplexer 106 (COLMUX). In some instances, the write driver T11 may be embodied as a transistor (e.g., NMOS transistor) that may operate as a diode or a clamp. As shown, the write driver T11 may be coupled between the word data line WDL and the negative source supply Vss, and the write driver T11 may receive the ND_WD signal as a gate input for activation, and operate as a WDL Vss clamp 228 for write driver pulldown. The write driver T11 may be coupled between the COLMUX 106 and the charge storage device C1 so as to provide a negative (−) bitline write assist (VSS_AST) to the at least one bitline (BL0, BL1, BL2, BL3) so as to mitigate write failures of write operations and to reduce voltage and/or current leakage (i_leak) through the write driver T11.

The WA 108 may include a pass transistor T12 that is coupled to the write driver T11 and the COLMUX 106 via a write data line WDL. In some instances, as shown, the pass transistor T12 may be coupled in parallel with the write driver T11 via the write data line WDL. Further, as shown, the pass transistor T12 may be coupled between the word data line WDL and the charge storage device C1 (or capacitor) at the first node n1, and the pass transistor T12 may be activated based on the ND signal.

The WA 108 may include a charge storage device C1 that is coupled between the pass transistor T12 and write assist enable circuitry 220 (WAE). In some instances, the charge storage device C1 may be embodied with or as a capacitor having positive (+) and negative (−) terminals, which may be coupled in either direction, depending on various specific implementations for various cathode/anode applications. As shown, the charge storage device C1 (or capacitor) may be coupled between the first node n1 and the write assist enable circuitry 224 (WEA). Further, at the first node n1, another transistor T13 may be coupled between the first node n1 and the negative voltage supply Vss, and the transistor T13 may be activated based on an FT_CTRL signal provided from an output of another inverter (i5). The inverter (i5) may receive the WA_END signal as an input and then provide the FT_CTRL signal as an output to a gate of the transistor T13.

The WA 108 may include a transmission gate 224 (e.g., having transistors T8, T9) that is coupled to a gate of the write driver T11. In some instances, the transmission gate 224 may include one or more transistors (e.g., T8, T9) that are coupled in parallel between a logic gate LG1 and the write driver T11. The transistor T8 (NMOS) may be activated based on a NWA_EN control signal, and the transistor T9 (PMOS) may be activated based on a WA_EN control signal. The control signals, NWA_EN, WA_EN may be complementary control signals. As shown, the transmission gate 224 (T8, T9) may receive and pass the ND signal and as the ND_WD signal.

The logic gate LG1 may be implemented with a NAND gate; however, in various other instances, the logic gate LG1 may be implemented with any various type of logic gate, such as, e.g., AND, NOT, OR, NOR, etc., or some combination thereof. As shown, the logic gate LG1 may receive the wclk and nd signals as input signal and provide the ND signal as an output signal.

The WA 108 may include a clamp transistor T10 that is coupled between the gate of write driver T11 and the charge storage device C1, so as to receive a (negative) voltage assist signal (VSS_AST) from the charge storage device C1 at the gate of the write driver T11. In some instances, the clamp transistor T10 may be coupled to a first node (n1) that is disposed between the pass transistor T12 and the charge storage device C1, and the clamp transistor T10 may be coupled to a second node (n2) that is disposed between the transmission gate 224 (T8, T9) and the write driver T11. Further, the clamp transistor T10 may be coupled between the first node n1 and the second node n2, so as to provide the voltage assist signal (VSS_AST) to the gate of the write driver T11, when the clamp transistor T10 is activated based on the WA_ENd control signal.

The WA 108 may include the write assist enable circuitry 220 (WEA) having one or more buffers and/or inverters (e.g., i1, i2, i3, i4) that are coupled in series with the charge storage device C1 to provide a capacitor control signal (CAP_CTRL) to the charge storage device C1 (or capacitor). In some instances, the write assist enable circuitry 220 (WEA) may provide the voltage assist signal (VSS_AST) to the charge storage device C1, depending on various specific implementations for various applications. As shown, the inverter (i1) may receive the WA_EN signal as an input and provide the NWA_EN signal as an output to the inverter (i2) at node n3. The inverter (i2) may receive the NWA_EN signal as an input and provide the NWA_ENd signal as an output to the inverter (i3) at node n4. The inverter (i3) may receive the NWA_ENd signal as an input and provide the NWA_END signal as an output to the inverter (i4) at node n5. The inverter (i4) may receive the NWA_END signal as an input and provide the CAP_CTRL signal as an output to the charge storage device C1 (or capacitor).

As described herein, various implementations assist with reducing (or, in some cases, eliminating) leakage through the write driver T11. As such, the write assist circuitry 108 may be configured for implementing self-compensating schemes and techniques for improved write assist efficiency. For instance, leakage from the WDL/VSS_AST through the write driver T11 (which may be implemented with a big or large transistor) may be reduced, or in some instances, eliminated. By having the gate and drain of the write driver T11 coupled at VSS_AST, the write driver T11 may operate (or function) as a Vss clamp, which may compensate for some or any leakage (e.g., i_leak2 and/or i_leak3). Further, in some instances, the write driver T11 may inhibit, prevent, or at least reduce a floating WDL/VSS_AST/BL from transitioning to a positive state.

Figure 3:
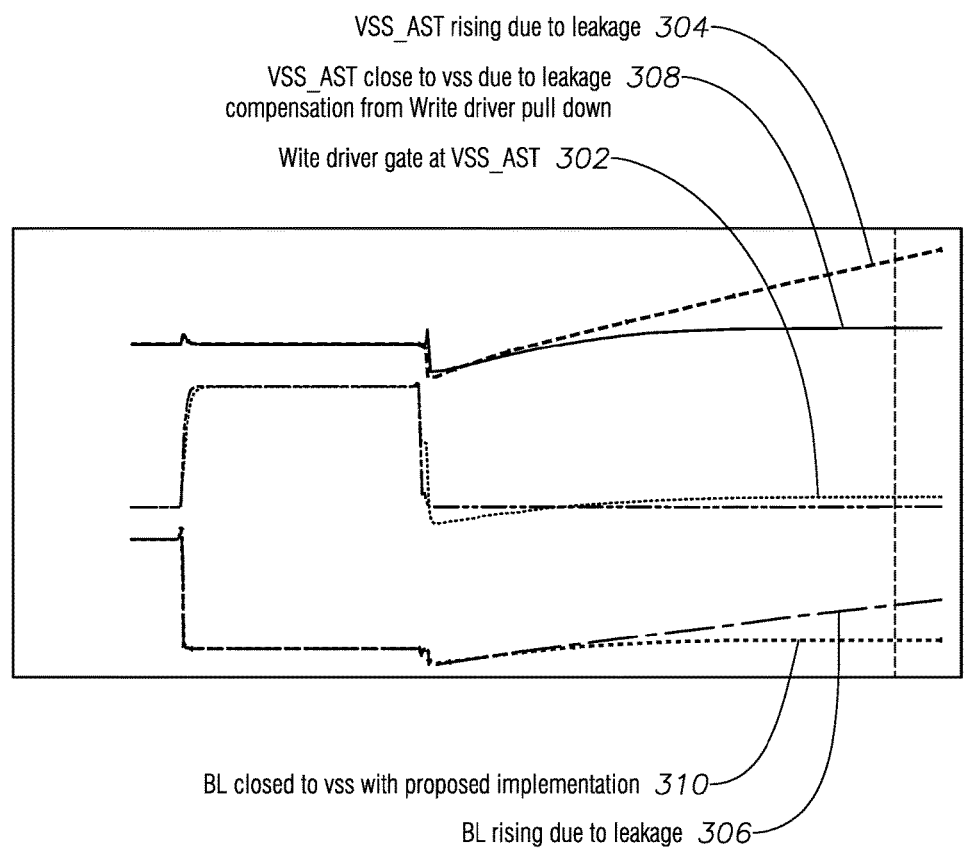
FIG. 3 illustrates a waveform diagram of memory circuitry in accordance with various implementations described herein.

FIG. 3 illustrates a waveform diagram 300 of memory circuitry in accordance with various implementations described herein. In some instances, the waveform diagram 300 shows a simulated waveform with and without implementing the various write assist schemes and techniques that are described herein.

In FIG. 3, the waveform diagram 300 shows a first simulated waveform 302 that is associated with the write driver gate at VSS_AST. The waveform diagram 300 shows a second simulated waveform 304 that is associated with VSS_AST rising due to leakage. The waveform diagram 300 shows a third simulated waveform 306 that is associated with the BL rising due to leakage. The waveform diagram 300 shows a fourth simulated waveform 308 that is associated with VSS_AST close to Vss due to leakage compensation from write driver pulldown. Further, the waveform diagram 300 shows a fifth simulated waveform 310 that is associated with the BL closed to Vss with the write assist schemes and techniques described herein.

Figure 4:
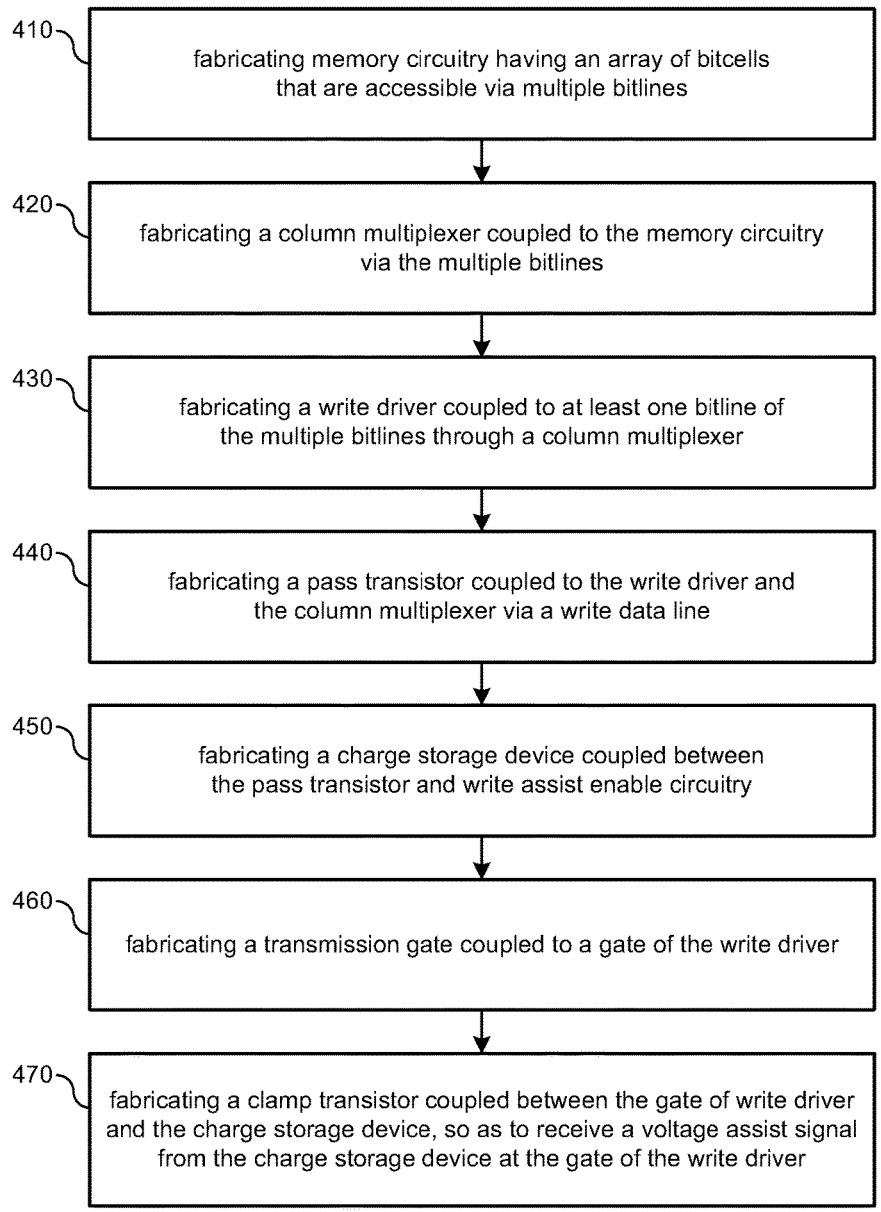
FIG. 4 illustrates a process diagram of a method for fabricating an integrated circuit in accordance with various implementations described herein.

FIG. 4 illustrates a process flow diagram of a method 400 for fabricating an integrated circuit in accordance with various implementations described herein.

It should be understood that even though method 400 may indicate a particular order of operation execution, in some cases, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various circuit elements, such as described herein above in reference to FIGS. 1-3. If implemented in software, method 400 may be implemented as a program or software instruction process that may be configured for power distribution circuitry as described herein. Further, if implemented in software, instructions related to implementing the method 400 may be stored in memory and/or a database. For instance, a computer or various other types of computing devices having a processor and memory may be configured to perform method 400.

As described and shown in reference to FIG. 4, method 400 may be utilized for manufacturing an integrated circuit (IC) that implements bitline write assist circuitry.

At block 410, method 400 may fabricate memory circuitry having an array of memory cells (or bitcells) that are accessible via one or more wordlines and one or more or multiple bitlines. The memory circuitry may be implemented with a core array that has an array of memory cells, wherein each memory cell may be referred to as a bitcell. Each memory cell may be configured to store at least one data bit value (e.g., data value related to a logical '0' or '1'). The array of memory cells may include any number of memory cells (or bitcells) that are arranged in various applicable configurations, such as, e.g., a 2D memory array having any number of columns and rows of multiple memory cells arranged in a 2D grid pattern with 2D indexing capabilities.

At block 420, method 400 may fabricate a column multiplexer coupled to the memory circuitry via the multiple bitlines. The column multiplexer circuitry may be coupled to the memory circuitry. In some instances, method 400 may fabricate write assist circuitry that is coupled to the memory circuitry via the column multiplexer circuitry. The write assist circuitry may include various multiple components, such as, e.g., a write driver, a pass transistor, a charge storage device (or capacitor), a transmission gate, and a clamp transistor.

At block 430, method 400 may fabricate a write driver coupled to at least one bitline of the multiple bitlines through a column multiplexer. The write driver may be coupled to the memory circuitry via the column multiplexer circuitry. The write driver may be implemented with a transistor that is arranged to operate as a diode or a clamp.

At block 440, method 400 may fabricate a pass transistor coupled to the write driver and the column multiplexer via a write data line. The pass transistor may be coupled to the write driver and the column multiplexer via a write data line. The pass transistor may be coupled in parallel with the write driver via the write data line.

At block 450, method 400 may fabricate a charge storage device coupled between the pass transistor and write assist enable circuitry. The charge storage device may be implemented as a capacitor. The charge storage device may be coupled between the pass transistor and write assist enable circuitry. The write assist enable circuitry may be implemented with one or more buffers and/or inverters that are coupled in series with the charge storage device, and in some instances, the write assist enable circuitry may provide the voltage assist signal (VSS_AST) to the charge storage device.

At block 460, method 400 may fabricate a transmission gate coupled to a gate of the write driver. The transmission gate may be coupled to the gate of the write driver, and the transmission gate may be implemented with one or more transistors that are coupled in parallel and arranged to operate as a transmission gate.

At block 470, method 400 may fabricate a clamp transistor coupled between the gate of write driver and the charge storage device, so as to receive a voltage assist signal from the charge storage device at the gate of the write driver. The clamp transistor may be coupled between a gate of write driver and the charge storage device so as to receive a voltage assist signal (VSS_AST) from the charge storage device at the gate of the write driver. In some instances, the write driver may be coupled between the word data line and a negative source supply Vss, and the write driver may receive an activation signal as a gate input for activation, and further, the write driver may operate as a word data line clamp for write driver pulldown, as described herein above. Further, the clamp transistor may be coupled to a first node that is disposed between the pass transistor and the charge storage device. The clamp transistor may be coupled to a second node that is disposed between the transmission gate and the write driver. Further, the clamp transistor may be coupled between the first node and the second node.

Described herein are various implementations of an integrated circuit. The integrated circuit may include memory circuitry having an array of bitcells that are accessible via multiple bitlines. The integrated circuit may include a write driver coupled to at least one bitline of the multiple bitlines through a column multiplexer. The integrated circuit may include a pass transistor coupled to the write driver and the column multiplexer via a write data line. The integrated circuit may include a charge storage device coupled between the pass transistor and write assist enable circuitry. The integrated circuit may include a transmission gate coupled to a gate of the write driver. The integrated circuit may include a clamp transistor coupled between the gate of write driver and the charge storage device such that the clamp transistor receives a voltage assist signal from the charge storage device at the gate of the write driver.

Described herein are various implementations of an integrated circuit. The integrated circuit may include memory circuitry, column multiplexer circuitry coupled to the memory circuitry, and write assist circuitry coupled to the memory circuitry via the column multiplexer circuitry. The write assist circuitry may include a first transistor coupled to the memory circuitry via the column multiplexer circuitry. The write assist circuitry may include a second transistor coupled to the first transistor and the column multiplexer via a write data line. The write assist circuitry may include a charge storage device coupled between the second transistor and write assist enable circuitry. The write assist circuitry may include a third transistor coupled between a gate of first transistor and the charge storage device such that the third transistor receives a voltage assist signal from the charge storage device at the gate of the first transistor.

Described herein are various implementations of a method for manufacturing or fabricating an integrated circuit. The method may include fabricating memory circuitry having an array of bitcells that are accessible via multiple bitlines. The method may include fabricating a column multiplexer coupled to the memory circuitry via the multiple bitlines. The method may include fabricating a write driver coupled to at least one bitline of the multiple bitlines through a column multiplexer. The method may include fabricating a pass transistor coupled to the write driver and the column multiplexer via a write data line. The method may include fabricating a charge storage device coupled between the pass transistor and write assist enable circuitry. The method may include fabricating a transmission gate coupled to a gate of the write driver. The method may further include fabricating a clamp transistor coupled between the gate of write driver and the charge storage device, wherein the clamp transistor is configured to receive a voltage assist signal from the charge storage device at the gate of the write driver.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting

[the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   memory circuitry having an array of bitcells that are accessible via multiple bitlines;
   a write driver coupled to at least one bitline of the multiple bitlines through a column multiplexer;
   a pass transistor coupled to the write driver and the column multiplexer via a write data line;
   a charge storage device coupled between the pass transistor and write assist enable circuitry;
   a transmission gate coupled to a gate of the write driver; and
   a clamp transistor coupled between the gate of write driver and the charge storage device such that the clamp transistor receives a voltage assist signal from the charge storage device at the gate of the write driver.

2. The integrated circuit of claim 1, wherein the write driver is coupled between the column multiplexer and the charge storage device to provide negative bitline write assist to the at least one bitline so as to mitigate write failures of write operations and to reduce voltage and/or current leakage through the write driver.

3. The integrated circuit of claim 1, wherein the write driver comprises a transistor and operates as a diode or a clamp.

4. The integrated circuit of claim 1, wherein the column multiplexer comprises one or more transistors that are coupled in parallel and are arranged to operate as a multiplexer.

5. The integrated circuit of claim 1, wherein the pass transistor is coupled in parallel with the write driver via the write data line.

6. The integrated circuit of claim 1, wherein the charge storage device comprises a capacitor.

7. The integrated circuit of claim 1, wherein the write assist enable circuitry comprises one or more buffers and/or inverters that are coupled in series with the charge storage device, and wherein the write assist enable circuitry provides the voltage assist signal to the charge storage device.

8. The integrated circuit of claim 1, wherein the transmission gate comprises one or more transistors that are coupled in parallel.

9. The integrated circuit of claim 1, wherein the clamp transistor is coupled to a first node that is disposed between the pass transistor and the charge storage device.

10. The integrated circuit of claim 9, wherein the clamp transistor is coupled to a second node that is disposed between the transmission gate and the write driver.

11. The integrated circuit of claim 10, wherein the clamp transistor is coupled between the first node and the second node.

12. An integrated circuit, comprising:
    memory circuitry;
    column multiplexer circuitry coupled to the memory circuitry; and
    write assist circuitry coupled to the memory circuitry via the column multiplexer circuitry, wherein the write assist circuitry comprises:
    a first transistor coupled to the memory circuitry via the column multiplexer circuitry;
    a second transistor coupled to the first transistor and the column multiplexer via a write data line;
    a charge storage device coupled between the second transistor and the write assist circuitry; and
    a third transistor coupled between a gate of first transistor and the charge storage device such that the third transistor receives a voltage assist signal from the charge storage device at the gate of the first transistor.

13. The integrated circuit of claim 12, further comprising a transmission gate that is coupled to the gate of the first transistor.

14. The integrated circuit of claim 12, wherein the first transistor comprises a write driver that operates as a diode or a clamp.

15. The integrated circuit of claim 12, wherein the second transistor operates as a pass transistor that is coupled in parallel with the first transistor via the write data line.

16. The integrated circuit of claim 12, wherein the charge storage device comprises a capacitor.

17. The integrated circuit of claim 12, wherein the write assist circuitry comprises one or more buffers and/or inverters that are coupled in series with the charge storage device, and wherein the write assist circuitry provides the voltage assist signal to the charge storage device.

18. The integrated circuit of claim 12, wherein the transmission gate comprises one or more transistors that are coupled in parallel.

19. The integrated circuit of claim 12, wherein:
    the third transistor is coupled to a first node that is disposed between the second transistor and the charge storage device,
    the third transistor is coupled to a second node that is disposed between the transmission gate and the first transistor, and
    the third transistor is coupled between the first node and the second node.

20. A method of fabricating an integrated circuit, comprising:
    fabricating memory circuitry having an array of bitcells that are accessible via multiple bitlines;
    fabricating a column multiplexer coupled to the memory circuitry via the multiple bitlines;
    fabricating a write driver coupled to at least one bitline of the multiple bitlines through the column multiplexer;
    fabricating a pass transistor coupled to the write driver and the column multiplexer via a write data line;
    fabricating a charge storage device coupled between the pass transistor and write assist enable circuitry;
    fabricating a transmission gate coupled to a gate of the write driver; and
    fabricating a clamp transistor coupled between the gate of the write driver and the charge storage device, the clamp transistor being configured to receive a voltage assist signal from the charge storage device at the gate of the write driver.

* * * * *